United States Patent
Okamura et al.

(10) Patent No.: US 7,923,740 B2
(45) Date of Patent: Apr. 12, 2011

(54) LIGHT EMISSION DEVICE

(75) Inventors: Masami Okamura, Kanagawa-Ken (JP); Masaaki Tamatani, Kanagawa-Ken (JP); Naomi Shida, Tokyo (JP); Kazuaki Ootsuka, Kanagawa-Ken (JP); Yukihiro Fukuta, Kanagawa-Ken (JP)

(73) Assignees: Kabushiki Kaisha Toshiba, Tokyo (JP); Toshiba Materials Co., Ltd., Yokohama-Shi (JP)

( * ) Notice: Subject to any disclaimer, the term of this patent is extended or adjusted under 35 U.S.C. 154(b) by 347 days.

(21) Appl. No.: 11/817,504

(22) PCT Filed: Feb. 23, 2006

(86) PCT No.: PCT/JP2006/303248
§ 371 (c)(1),
(2), (4) Date: Jan. 11, 2008

(87) PCT Pub. No.: WO2006/093011
PCT Pub. Date: Sep. 8, 2006

(65) Prior Publication Data
US 2009/0057698 A1 Mar. 5, 2009

(30) Foreign Application Priority Data
Mar. 1, 2005 (JP) .................. 2005-055511

(51) Int. Cl.
*H01L 33/00* (2010.01)

(52) U.S. Cl. .................. 257/98; 438/27; 257/E33.067

(58) Field of Classification Search .................. 257/98, 257/E33.067, E33.074, E33.061; 438/27, 438/29; 313/502–504
See application file for complete search history.

(56) References Cited

U.S. PATENT DOCUMENTS

| 6,501,100 B1* | 12/2002 | Srivastava et al. ............... 257/79 |
| 6,703,780 B2* | 3/2004 | Shiang et al. ................... 313/504 |
| 7,361,938 B2* | 4/2008 | Mueller et al. ................... 257/94 |
| 7,553,683 B2* | 6/2009 | Martin et al. .................... 438/29 |
| 2006/0100088 A1* | 5/2006 | Loureiro et al. ............... 501/152 |
| 2006/0124951 A1* | 6/2006 | Sakata et al. .................... 257/99 |

FOREIGN PATENT DOCUMENTS

| JP | 10 36833 | 2/1998 |
| JP | 2002 141559 | 5/2002 |
| JP | 2005 255747 | 9/2005 |

* cited by examiner

*Primary Examiner* — Matthew C Landau
*Assistant Examiner* — Jessica Hall
(74) *Attorney, Agent, or Firm* — Oblon, Spivak, McClelland, Maier & Neustadt, L.L.P.

(57) ABSTRACT

The present invention relates to a light emitting apparatus including a semiconductor light emitting element and a transparent ceramic phosphor for converting a wavelength of a light emitted from the semiconductor light emitting element, wherein the semiconductor light emitting element emits an ultraviolet light, and the ceramic phosphor corresponding to the semiconductor light emitting element has (i) a minimum transmission of 0.1 to 40% under a wavelength of 350-420 nm and (ii) a transmission of 10 to 90% under an emission peak wavelength of the ceramic phosphor.

20 Claims, 2 Drawing Sheets

LIGHT EMISSION DEVICE

TECHNICAL FIELD

The present invention relates to a light emitting apparatus in which a light emitted from a light emitting diode is subjected to a wavelength conversion by a ceramic phosphor thereby to irradiate the light to outside. More specifically, the present invention relates to a light emitting apparatus having a high light-extraction efficiency of extracting the light emitted from the ceramic phosphors and is excellent in luminescence intensity.

BACKGROUND ART

A light emitting diode (LED) is a semiconductor diode for radiating light, and has a function of converting an electrical energy into visible light or ultraviolet light. Particularly, for the purpose of utilizing the visible lights, there has been widely used as LED lamp in which a semiconductor light emitting element (light emitting chip) formed of light emitting materials such as GaP, GaAsP, GaAlAs or the like is sealed by a transparent resin or the like. Further, there has been also widely used as light emitting apparatuses such as display-type LED lamp or the like in which the light emitting material is fixed on an upper surface of a printed circuit board or a metal lead, and the fixed material is sealed by a resin case formed in a shape of numerical character or letter.

Further, when various phosphor powders are contained into a front surface of the semiconductor light emitting element or contained in the resin covering the light emitting diode, the light emitting apparatus capable of suitably controlling the color of the emitted lights has been also in practical use. That is, there has been known also a light emitting apparatus comprising: a gallium nitride type light emitting diode for emitting blue lights or ultraviolet lights; and a phosphor excited by the blue lights or the ultraviolet lights for emitting visible lights having a different wavelength, so that a white light is generated by an appropriate color mixing operation.

In this light emitting apparatus, for example, there has been used a yttrium.aluminum.garnet (YAG) type phosphor having a composition of $[(R, Sm)_3(Al, Ga)_5O_{12}]$ or the like. In the above light emitting apparatus, the light emitting diode chip is fixed into an appropriate cup, and slurry prepared by blending a predetermined phosphor powder and a suitable resin is injected into the cup, followed by drying the injected material, thereby to form a phosphor layer.

FIG. 4 is a cross sectional view showing another example of a structure of a conventional light emitting apparatus comprising: the above semiconductor light emitting element (light emitting diode chip); and phosphor powders dispersed around the light emitting diode chip through a resin material. This light emitting apparatus is a surface-mounting type light emitting apparatus (SMD: Surface Mount Device) which is suitable for performing a high density package onto a mounting board.

The above semiconductor light emitting element (LED chip) 2 is adhered onto a first lead 3 by means of an adhesive agent 4 or the like. A first electrode provided onto an upper surface of the semiconductor light emitting element 2 is connected to a first lead 3 by a bonding wire 5. Further, a second electrode provided onto the upper surface of the semiconductor light emitting element 2 is connected to a second lead 7 by a bonding wire 6. Both the first and second leads 3 and 7 are connected onto a lead frame in advance. In this state, the first and second leads 3 and 7 are embedded by an injection molding method using a thermoplastic resin 8, thereby to be fixed. On to the first and second leads 3 and 7 are provided with the thermoplastic resin 8 for forming a concave portion into which the semiconductor light emitting element 2 is accommodated.

As a material for constituting the semiconductor light emitting element 2, for example, GaN type material or InGaAlP type material is used. For example, an ultraviolet light having a waveband of 330-400 nm is emitted from the GaN type light emitting element, while visible light having a waveband of 400-700 nm is emitted from the InGaAlP type light emitting element. The semiconductor light emitting element 2 is sealed by a transparent resin, and phosphor grains 10 are dispersed in the transparent resin 9. A primary light emitted from the semiconductor light emitting element 2 is absorbed by the phosphor grains 10 and subjected to a wavelength conversion thereby to be emitted as a secondary light such as white light or the like.

In this regard, the light emitting diode lamp and the light emitting apparatus can reproduce various lights in visible light region having color region ranging from blue to red which is suitably determined for concrete use. Furthermore, since the light emitting diode (LED) is a semiconductor element, LED has a long life property and a high reliability, so that an exchanging frequency of LED due to failure is effectively decreased when the LED is used as a light source. Therefore, LED has been widely used as a constituting part of mobile communication devices, personal computer peripheral equipments, OA (office automation) devices, household electrical appliances, audiovisual apparatuses, various switches, various display devices such as light source display plate for backlight or the like. Patent Document 1: Japanese Patent (Publication) No. HEI 10-215001

However, since the powdery phosphor used in the above conventional light emitting apparatus was opaque, the light emitted from an inner portion of the phosphor layer formed by piling up the phosphor powders was disadvantageously absorbed and scattered by the opaque phosphors located at outside the outstanding phosphor. As a result, it was difficult to effectively extract the emitted light to outside the light emitting element.

In order to cope with the above situation, in a case where a thickness of the phosphor layer is decreased to be thin for the purpose of increasing the light extraction efficiency of extracting the light emitted from the phosphor toward outside, among a total amount of the lights emitted from the semiconductor light emitting element, an amount of light which is not effectively absorbed in the phosphor and uselessly emitted to outside of the light emitting element is increased, thereby to lower an entire light extracting efficiency of the light emitting apparatus.

On the other hand, in a case where the thickness of the phosphor layer is increased to be thick for the purpose of allowing the phosphor layer to sufficiently absorb the light emitted from the semiconductor light emitting element, the light extraction efficiency of extracting the light emitted from the phosphor is also disadvantageously lowered, so that there had been posed a problem of lowering the entire light extracting efficiency of the light emitting apparatus.

Further, in a case where a semiconductor light emitting element for emitting ultraviolet light is used, the resin mixed with the phosphor powder was liable to be deteriorated by the ultraviolet light, so that there had been posed a problem that a life duration of the light emitting apparatus was disadvantageously limited and the durability of the light emitting apparatus was also lowered. Furthermore, in production lines of a light emitting apparatus formed by using a dip method, there was a difficulty of that a processing time required until the resin was cured was long, so that a mass-productivity of the light emitting apparatus was disadvantageously lowered.

Further, in the conventional light emitting diode apparatus, a color tone of the emitted light is determined by a concentration and an injection amount of the phosphor powder to be contained in the resin. However, a difference in specific gravity between the resin and the phosphor powder is large, so that a management of the concentration of the phosphor is difficult. As a result, there has been also posed a problem that the concentration of the phosphor becomes uneven for the respective operations of injecting the phosphor.

Furthermore, an injection amount of a resin suspension of the phosphor with respect to each of the light emitting apparatus is extremely small to be 0.1 mcc or less, so that it was extremely difficult to accurately control such a small amount so as to have a predetermined value in a level of mass-production process. As a result, there has been arisen a problem that the injection amount and a content of the phosphor are greatly fluctuated, so that the color tone of the light emitted from the light emitting apparatus is not uniform.

As a method of solving such problems, there has been known a countermeasure in which the phosphor was contained in a solid-state resin. In this case, however, the concentration of the phosphor is low and a sufficient emission output could not be obtained. In addition, in this case, when the concentration of the phosphor is increased, there has been arisen a problem to be technically solved such that a transparency of the resin layer containing the phosphor is lowered thereby to decrease the emission output.

The present invention has been achieved to solve the above conventional problems, and an object of the present invention is to provide a light emitting apparatus having a high light-extraction efficiency of extracting the light emitted from the phosphors and is excellent in luminescence intensity.

DISCLOSURE OF INVENTION

In order to achieve the above object, the present invention provides a light emitting apparatus comprising: a semiconductor light emitting element; and a transparent (transmissive) ceramic phosphor for converting a wavelength of a light emitted from the semiconductor light emitting element, wherein the semiconductor light emitting element emits an ultraviolet light, and the ceramic phosphor corresponding to the semiconductor light emitting element has: a minimum transmission of 0.1 to 40% under a wavelength of 350-420 nm; and a transmission of 10 to 90% under an emission peak wavelength of the ceramic phosphor.

In another aspect of the present invention, there is provided a light emitting apparatus comprising: a semiconductor light emitting element; and a transparent ceramic phosphor for converting a wavelength of a light emitted from the semiconductor light emitting element, wherein the semiconductor light emitting element emits a blue light, and the ceramic phosphor corresponding to the semiconductor light emitting element has: a minimum transmission of 20 to 80% under a wavelength of 420-500 nm; and a transmission of 10 to 90% under an emission peak wavelength of the ceramic phosphor.

In the light emitting apparatus according to the present invention, the ceramic phosphor having a predetermined transparency with respect to a using light having a wavelength is used, so that the light emitted from an inner portion of the phosphor can be effectively extracted to outside of the light emitting apparatus without being absorbed or scattered by an opaque phosphor powder, even if there is used a phosphor having a large thickness enough to sufficiently absorb the light emitted from the semiconductor light emitting element.

In addition, all of the constituting parts including the phosphor can be formed in a solid state without using a resin-suspension liquid of phosphor, an industrial production efficiency of the light emitting apparatus can be remarkably improved.

In this regard, in a case where the semiconductor light emitting element emitting the ultraviolet light is used, it is importance to control so that the ceramic phosphor has: a minimum transmission ranging from 0.1% to 40% under a wavelength of 350-420 nm; and simultaneously has a transmission ranging from 10% to 90% under an emission peak wavelength of the ceramic phosphor.

While, in a case where the semiconductor light emitting element emitting the blue color light is used, it is importance to control so that the ceramic phosphor has: a minimum transmission ranging from 20% to 80% under a wavelength of 420-500 nm; and simultaneously has a transmission ranging from 10% to 90% under an emission peak wavelength of the ceramic phosphor.

In case of the semiconductor light emitting element for emitting the ultraviolet light, when the minimum transmission of the ceramic phosphor is less than 0.1% under a wavelength of 350-420 nm which is a light emitting wavelength region, although an absorbing efficiency of the light emitted from the semiconductor light emitting element is increased, a portion not emitting a light is simultaneously increased in the inner portion of the phosphor layer, thereby to lower the luminous efficiency of the entire light emitting apparatus.

In contrast, in case of the semiconductor light emitting element for emitting the ultraviolet light, when the minimum transmission of the ceramic phosphor exceeds 40% under a wavelength of 350-420 nm, the light to be absorbed in the ceramic phosphor is decreased, thereby to also lower the luminous efficiency of the apparatus.

On the other hand, in case of the semiconductor light emitting element for emitting the blue color light, when the minimum transmission of the ceramic phosphor is less than 20% under a wavelength of 420-500 nm which is a light emitting wavelength region, although an absorbing efficiency of the light emitted from the semiconductor light emitting element is increased, a blue color light component transmitted through the light emitting element to outside is decreased, thereby to deteriorate a color rendering property.

In contrast, in case of the semiconductor light emitting element for emitting the blue color light, when the minimum transmission of the ceramic phosphor exceeds 80% under a wavelength of 420-500 nm, the light to be absorbed in the ceramic phosphor is decreased thereby to lower the luminous efficiency. Simultaneously, the blue color light component transmitted through the light emitting element to outside is increased thereby to also deteriorate the color rendering property.

In the above respective light emitting apparatuses, when the transmission in the ceramic phosphor under the emission peak wavelength is less than 10%, the light emitted from an inner portion of the ceramic phosphor cannot be effectively extracted to outside of the ceramic phosphor, thereby to lower the luminous efficiency.

On the other hand, it is possible to increase the transmission in the ceramic phosphor under the emission peak wavelength so as to be higher than 90%. However, in order to manufacture the ceramic phosphor having such a high transparency, it is necessary to extremely reduce an amount of impurities to be contained in the phosphor, thus being unsuitable as an industrial process.

In order to realize the transparent ceramic phosphor as described above, it is preferable to control the impurity amount to be as low as possible, and simultaneously, a sintering agent shall not be used. In addition, in order to decrease micro pores (voids) resulting in a cause of scattering of the lights, it is important to increase a density of a sintered body constituting the ceramic phosphor.

Further, in the above light emitting apparatus, it is preferable that the ceramic phosphor has at least part of surface of which average surface roughness is 0.5 to 150 μm in terms of arithmetical average surface roughness Ra. When the average surface roughness of the outer surface of the ceramic phosphor is controlled to within a range of 0.5 to 150 μm, a higher luminous intensity can be obtained.

In this connection, the outer surface of the ceramic phosphor means a surface for emitting a light which can be substantially utilized as the light emitting apparatus. In a case where the average surface roughness is less than 0.5 μm, the light emitted from the ceramic phosphor is liable to cause a total reflection at a boundary portion between air and the ceramic phosphor, thereby to disadvantageously lower the luminous intensity. On the other hand, when the above average surface roughness exceeds 150 μm, the surface roughness is excessively coarse and substantially acts as a mirror surface with respect to the wavelength of the light, thereby to increase the scattering of the light.

Furthermore, in the above light emitting apparatus, it is preferable that the ceramic phosphor has an outer surface of which average surface roughness is 0.5 to 150 μm in terms of arithmetical average surface roughness Ra. The outer surface of the ceramic phosphor is a surface for emitting a light which has been subjected to a wavelength conversion. When the surface roughness of the outer surface is set to within the above predetermined range, the total reflection and the scattering at the outer surface can be prevented, whereby it becomes possible to increase the luminous intensity.

The above surface roughness can be realized through various machining processes such as, for example, polishing using a tool formed with a surface having an appropriate roughness, and cutting by means of a blade surface having an appropriate roughness. Further, there can be also adopted a method in which the surface is coarsened by etching treatment. In case of the ceramic phosphor, due to difference in crystal orientation of the respective crystal grains, an etching rate for the respective portions is also different, thereby to cause a roughness on the surface of the ceramic phosphor.

Further, in the above light emitting apparatus, it is preferable that the ceramic phosphor is formed with a projection having a maximum height of 0.15 to 2 mm and the projection is formed at least part of surface of the ceramic phosphor.

Furthermore, in the above light emitting apparatus, it is preferable that the ceramic phosphor has an outer surface formed with a projection having a maximum height of 0.15 to 2 mm and the projection is formed at least part of surface of the ceramic phosphor.

The above projection having a predetermined height exhibits the same function and effect as in irregularities having the above predetermined surface roughness range. When the height of the projection is less than 0.15 mm, the light emitted from the ceramic phosphor is liable to cause the total reflection at a boundary portion between air and the ceramic phosphor, thereby to disadvantageously lower the luminous intensity. On the other hand, when the above height of the projection exceeds 2 mm, the projection becomes excessively large and the surface of the projection substantially acts as a mirror surface with respect to the wavelength of the light, thereby to increase the scattering of the light.

In addition, as the same function as in the above surface roughness, when the height of the projection formed at the outer surface of the ceramic phosphor is set to within the above predetermined range, the total reflection and the scattering at the outer surface can be prevented, whereby it becomes possible to increase the luminous intensity.

In general, when a ceramic phosphor is subjected to a machine work, there may be a fear that the transparency of the ceramic phosphor is lowered due to mechanical damages. In this case, when an appropriate heat treatment is performed after completion of the machine work for the ceramic phosphor, it becomes possible to effectively alleviate distortions that cause the lowering of the transparency, thus being effective for restoring the transparency of the ceramic phosphor.

The ceramic phosphor having such a high transparency as described above is manufactured as a sintered body through a method comprising the steps of: molding a phosphor powder for emitting a light having a predetermined wavelength thereby to form a molded body; and calcining the molded body thereby to form the sintered body. Particularly, in order to obtain a ceramic phosphor having a high transparency, it is important to increase a density of the resultant sintered body. Concretely, it is preferable that a relative density of the sintered body as the ceramic phosphor is set to within a range of 99.50 to 99.98%. When relative density of the sintered body is less than 99.50%, the transparency of the sintered body is disadvantageously lowered due to an influence of the scattering of the light at the pores or voids existing in the inner portion of the sintered body.

On the other hand, in order to realize a sintered body having a relative density of 99.98% or more, there are required complicated operations such that impurities are strictly controlled so as to extremely lower the impurity amount, or a temperature as sintering condition of HIP (hot isostatic pressing) and hot pressing or the like is greatly risen, this being unsuitable as industrial process condition.

According to the present invention, the ceramic phosphor in a shape of solid which is prepared by sintering a phosphor powder is used, and a slurry prepared by blending a resin and the phosphor powder each having a large difference in specific gravity therebetween is not used, so that it becomes unnecessary to control the concentration of the phosphor powder in the slurry or an injection amount of the slurry, whereby the color tones of the lights emitted from the respective light emitting apparatuses can be formed to be uniform.

A composition of the above ceramic phosphor is not particularly limited. However, one or two or more of the phosphors having the following main compositions are suitably used. Example of the phosphors may include: silicate, aluminate, phosphate, halo-phosphate, borate, oxide, tungstate, salt of vanadic acid, oxy sulfide, sulfide, nitride, oxy nitride or the like.

More concretely, as example of a phosphor for emitting various lights by absorbing a blue color light, there can be used (Sr, Ba, Ca)$_2$SiO$_4$:Eu, (Y, Gd)$_3$(Al, Ga)$_5$O$_{12}$:Ce, SrGa$_2$S$_4$:Eu, as a yellow color light emitting phosphor, and there can be also used 3.5MgO.0.5MgF$_2$.GeO$_2$:Mn, as a red color light emitting phosphor.

As example of a phosphor for emitting various lights by absorbing an ultraviolet light, there can be suitably used: La$_2$O$_2$S:Eu, Sm as a red color light emitting phosphor; BaMgAl$_{10}$O$_{17}$:Eu, Mn, as a green color light emitting phosphor; (Sr, Ca)$_5$(PO$_4$)$_3$Cl:Eu, as a blue color light emitting phosphor; (Sr, Ba, Ca)$_2$SiO$_4$:Eu, as a yellow color light emitting phosphor.

As a method of manufacturing the above ceramic phosphor, for example, the following methods can be adopted.

Namely, at first, a phosphor powder is obtained through methods such as a coprecipitation method, a solid reaction method, a gas-phase reaction method in which various gasses and a solid substance are reacted to each other. Thereafter, the prepared phosphor powder is calcined or sintered at a high temperature suitable for the phosphor material, thereby to control grain size, composition, uniformity, internal defects or the like of the sintered body.

By the way, when a phosphor composition in a case where phosphor powder grains are dispersed in resin and disposed around the semiconductor light-emitting element is compared with that of a case where a sintered body (ceramic phosphor) is disposed as in the present invention, there exists an optimum value of a concentration of an activating agent in the latter case. Namely, at the optimum value where the concentration of the activating agent contained in the phosphor composition is small, there exists a portion at which a luminous intensity becomes to be maximum.

For example, when the phosphor having a composition of $(Sr, Ba, Ca)_2SiO_4$:Eu for emitting a yellow color light is manufactured, at first, each of predetermined amounts of phosphor material composed of strontium carbonate, barium carbonate, calcium carbonate, europium oxide and silica is weighted to prepare powder materials. Then, ammonium chloride as crystal growing agent is added to the powder materials at an amount of 2 wt. % with respect to the powder materials and the materials are sufficiently blended thereby to prepare a material mixture.

Next, the material mixture is injected into a crucible made of alumina, and the material mixture is calcined in air atmosphere under the temperature condition of 600° C. for one hour. After cooling the crucible, the calcined material is well mixed. Subsequently, the mixture is injected into an alumina crucible, and then sintered in a reductive atmosphere composed of hydrogen gas and nitrogen gas at a temperature condition of 1200° C. for two hours. Thus obtained sintered body is then pulverized, followed by wet-cleaning and drying. The dried material is passed through a sieve (screen) of which opening is 30 μm, thereby to obtain an aimed phosphor powder.

Further, when the phosphor having a composition of $La_2O_2S$:Eu, Sm for emitting a red color light is manufactured, at first, appropriate amounts of lanthanum oxide, europium oxide and samarium oxide are dissolved into nitric acid to prepare a material solution. Then, oxalic acid solution is added to this material solution, thereby to obtain a coprecipitation substance of oxalate. The coprecipitation substance is then sintered in air atmosphere at a temperature of 1000° C. thereby to be converted into oxide. This oxide is mixed with predetermined amounts of sulfur, sodium carbonate and phosphoric acid alkaline powder. Thus obtained mixture is injected into a crucible made of alumina and an airtight lid is attached to the crucible. In this state, the mixture is sintered at a temperature condition of 1100° C. for five hours. Thus obtained sintered body is sufficiently wet-cleaned, followed by drying. The dried material is passed through the sieve, thereby to obtain an aimed phosphor.

The above powder mixture of phosphor is shaped through a rubber pressing method thereby to prepare a pressed compact having an appropriate shape. Thereafter, the pressed compact is injected into a metal container or the like and the metal container is sealed, followed by conducting a HIP (hot isostatic pressing) treatment, thereby to obtain a transparent ceramic phosphor. A HIP temperature (sintering temperature) varies depending on a kind of material to be used, however, there exists a temperature range for the respective materials. In general, when the HIP temperature is excessively lower than the suitable temperature, a growth of the crystal grains is insufficient, the relative density of the resultant ceramic phosphor is low, and scattering of the light at pores and voids in the phosphor is increased, so that the transparency of the ceramic phosphor is impaired.

On the other hand, when the HIP temperature is excessively higher than the suitable temperature, the growth of the crystal grains is rapidly advanced and the crystal grains are coarsened, so that the transparency of the ceramic phosphor is also impaired due to an influence of grain boundaries. In this connection, it is also possible to prepare a sintered body of the phosphor by conducting only a high temperature sintering operation without conducting the HIP treatment.

Concrete manufacturing conditions will be explained hereunder by taking an example in which the ceramic phosphor having the composition of $(Sr, Ba, Ca)_2SiO_4$:Eu is manufactured. It is preferable that the HIP temperature is set to within a range of 1000 to 1500° C. More preferable temperature range is 1200 to 1300° C. Further, HIP pressure shall be set to 98 MPa or higher.

When the HIP pressure is lower than 98 MPa, a densification effect of the HIP treatment cannot be sufficiently obtained. HIP time varies depending on the HIP temperature and the HIP pressure. However, in a case where the HIP temperature is set to a range of 1200 to 1300° C. and the HIP pressure is set to 98 MPa or higher, it is preferable that HIP time is set to within a range of 5 to 7 hours.

In a case where the ceramic phosphor having the composition of $La_2O_2S$:Eu, Sm is manufactured, it is preferable that the HIP temperature is set to within a range of 1200 to 1500° C. More preferable temperature range is 1300 to 1400° C. In a case where the HIP temperature is set to a range of 1300 to 1400° C. and the HIP pressure is set to 98 MPa or higher, it is preferable that HIP time is set to within a range of 5 to 7 hours.

Thus prepared sintered body is subjected to machine-work such as dicing work so as to provide a predetermined shape, and if necessary, the sintered body is heat-treated in an inert-gas atmosphere, thereby to obtain the ceramic phosphor.

Further, in the aforementioned light emitting apparatus, it is preferable that the ceramic phosphor 11*b* is formed in a shape of a cannonball of which sectional diameter is decreased in top end direction as shown in FIG. 3. In this case, the light emitted from the semiconductor light-emitting element 2 is irradiated in such a manner that the light is refracted toward a central direction, so that there exhibits, so called "lens effect" in which a flux of the light is aligned toward an inherent light emitting direction. As a result, a light emitting intensity toward a front side direction can be increased.

Furthermore, in the aforementioned light emitting apparatus, it is also preferable that the ceramic phosphor is covered with a reflecting member at a portion other than the outer surface of the ceramic phosphor. As the reflecting member, a thin film composed of aluminum (Al) or silver (Ag) and having a thickness of about several microns is preferably used. As described above, when the above reflecting member is formed to a portion such as side portion or the like other than the outer surface of the ceramic phosphor, it becomes possible to reflect the light, which is fugitively emitting through the side surface portion of the ceramic phosphor, toward the inherent radiating direction. As a result, a luminous intensity of entire light emitting apparatus can be increased.

Still further, in the aforementioned light emitting apparatus, it is also possible to configure the ceramic phosphor by laminating a plurality of ceramic phosphor layers each having a different composition. The ceramic phosphor used in the present invention may be formed as an integrated phosphor which is formed by sintering a uniformly mixed material composed of blue, green, red color lights emitting phosphors.

However, when the ceramic phosphor is configured by laminating a plurality of ceramic phosphor layers each having a different composition, an arranging ratio of the respective phosphor components can be set to constant level in a direction normal to the light emitting direction.

As described above, according to the light emitting apparatus of the present invention, it becomes possible to provide a light emitting apparatus having a high luminous efficiency and an excellence in industrial productivity. In addition, all of the constituting parts including the phosphor can be formed in a solid state, an industrial production efficiency of the light emitting apparatus can be remarkably improved.

BEST MODE FOR CARRYING OUT THE INVENTION

Next, embodiments of the light emitting apparatuses according to the present invention will be explained and illustrated in more detail with reference to the attached drawings and the following Examples.

Example 1

0.9 mol of strontium carbonate, 0.08 mol of barium carbonate, 0.02 mol of calcium carbonate, 0.001 mol of europium oxide and 0.5 mol of silica were weighted to prepare a phosphor material. Then, ammonium chloride was added to the phosphor material at an amount of 2 mass % with respect to the phosphor material and the phosphor material was sufficiently blended thereby to prepare a material mixture. Next, the material mixture was injected into a crucible made of alumina and the material mixture was calcined in air atmosphere under the temperature condition of 600° C. for one hour. After cooling the crucible, the calcined material was well mixed. Subsequently, the mixture was injected into the alumina crucible, and then sintered in a reductive atmosphere composed of 3%-hydrogen gas and nitrogen gas at a temperature condition of 1200° C. for two hours. Thus obtained sintered body was then pulverized, followed by wet-cleaning and drying. The dried material was passed through a sieve (screen) of which opening was 30 µm, thereby to obtain a ceramic phosphor powder.

This phosphor powder was shaped through a rubber pressing method thereby to prepare a pressed compact. Thereafter, the pressed compact was injected into a nickel metal container and the nickel metal container was sealed by a vacuum baking, followed by conducting a HIP treatment under a temperature condition of 1200° C. and a pressing force of 150 MPa. After completion of this HIP treatment, the metal container was broken so as to take out an ingot from which a sintered body of a circular disc-shaped ceramic phosphor 11 having a diameter of 2 mm and a thickness T of 0.4 mm was cut out by conducting a dicing work. A density of this sintered body was 99.8% with respect to a true specific density, while a transmission of a light having wavelength of 570 nm was 60% and a transmission of a light having wavelength of 470 nm was 40%. In addition, a surface roughness Ra of each of upper and lower surfaces of the ceramic phosphor was 50 µm.

On the other hand, a flip chip type semiconductor light emitting diode having an emission peak wavelength of 470 nm and a size of 200 µm×200 µm was prepared, and there was prepared a packaging container having a diameter of 2 mm and a white-colored reflecting member 12 composed of Al-deposition film having a thickness of 3 µm provided to a bottom surface and a wall surface of the packaging container.

The above circular disc-shaped ceramic phosphor 11 was positioned at a center of the bottom surface of the packaging container, and was adhered by an adhesive agent composed of a thin epoxy resin so that air was not mixed into a space between the ceramic phosphor 11 and the packaging container.

FIG. 1 is a sectional view showing a light emitting apparatus 1a according to Example 1 having a flip tip structure as prepared above. Note, the same reference numerals are attached to the same structural members or elements as in the conventional light emitting apparatus shown in FIG. 4.

The light emitting apparatus 1a according to Example 1 comprises: a light emitting diode as a semiconductor light-emitting element 2; and a ceramic phosphor 11 fixed onto an upper surface side of the semiconductor light-emitting element 2 by means of, for example, a transparent adhesive agent. The semiconductor light-emitting element 2 is adhered onto a first lead 3 by means of an adhesive agent or the like.

A first electrode provided to an upper surface of the semiconductor light-emitting element 2 is connected to the first lead 3 by a bonding wire 5. While, a second electrode provided to an upper surface of the semiconductor light-emitting element 2 is connected to the second lead 7 by a bonding wire 6. The above first and second leads 3, 7 are connected onto a lead frame in advance, and then the first and second leads 3, 7 are embedded and fixed by an injection molding method using a thermoplastic resin 8 or the like. On the first lead 3 and the second lead 7 are provided with the thermoplastic resin 8 for forming a concave portion for accommodating the semiconductor light-emitting element 2 therein.

In the light emitting apparatus 1a according to Example 1, the light emitted from the semiconductor light-emitting element 2 is subjected to a wavelength conversion at the time of transmission through the ceramic phosphor 11, and the light is emitted from the ceramic phosphor 11 as a visible light or the like. When an electric power of 3.5 volts and 20 mA was inputted to the light emitting apparatus 1a of Example 1, an emission output power was 600 mCd/m$^2$, while an emission chromaticity was: x=0.27, y=0.25.

As described above, according to the present Example, the ceramic phosphor 11 having a predetermined transparency with respect to the using light having a wavelength was used, so that the light emitted from an inner portion of the phosphor could be effectively extracted to outside of the light emitting apparatus without being absorbed or scattered by an opaque phosphor powder. In addition, all of the constituting parts including the phosphor could be formed in a solid state without using a resin-suspension liquid of phosphor, an industrial production efficiency of the light emitting apparatus could be remarkably improved.

Examples 2-4

The same manufacturing process as in Example 1 was repeated except that only a thickness of the sintered body of the circular-plate-shaped ceramic phosphor 11 prepared in Example 1 was changed as shown in Table 1. Each of the ceramic phosphors 11 was attached to a central portion of a bottom surface of a packaging container, thereby to prepare respective light emitting apparatus of Examples 2-4 each having the same structure as in Example 1 shown in FIG. 1.

With respect to each of thus prepared light emitting apparatuses 1a, an emission output and an emission chromaticity were measured at a time when an electric power was inputted under the same conditions as in Example 1, thereby to obtain results shown in Table 1 hereunder.

TABLE 1

| Sample No. | Thickness of Ceramic Phosphor (Sintered Body) (mm) | Emission Output (mCd/m$^2$) | Emission Chromaticity (x, y) |
|---|---|---|---|
| Example 2 | 0.6 | 650 | 0.31, 0.30 |
| Example 3 | 0.8 | 680 | 0.33, 0.34 |
| Example 4 | 1.0 | 700 | 0.35, 0.36 |

As is clear from the results shown in Table 1, according to the light emitting apparatuses of the respective Examples in which the ceramic phosphors 11 having a predetermined transparency was used, it was evidenced that the light emitted from the inner portion of the ceramic phosphor could be effectively extracted with a high emission output to outside of the light emitting apparatus without being absorbed or scattered by an opaque phosphor powder. In addition, the emission chromaticity of the emitted light was also excellent.

Comparative Example 1

6 mg of the phosphor powder used in Example 1 was weighted. This amount was the same as that of the ceramic phosphor used in Example 1. This phosphor powder was dispersed into epoxy resin thereby to prepare a suspended liquid, and the suspended liquid was then injected onto the semiconductor light-emitting element 2 disposed in the packaging container, thereby to prepare a conventional light emitting apparatus of Comparative Example 1.

When the above light emitting apparatus was operated under the same power-applying conditions as in Example 1, the emission output (light intensity, luminosity) of the light emitting apparatus was 100 mCd/m$^2$, while the emission chromaticity was: x=0.48, y=0.51. Therefore, it was confirmed that the emission output was disadvantageously lowered in comparison with the respective Examples 1-4. Further, and the emission chromaticity was almost composed of a color light emitted from only the phosphor, and was deviated from that of a white color light.

Example 5

The same manufacturing processes of material mixing, molding and sintering as in Example 1 were repeated under the same conditions in Example 1 except that the ratio of the europium oxide to be contained in the phosphor material was changed to 0.004 mol, thereby to prepare a circular-plate-shaped ceramic phosphor as a sintered body.

A density (relative density) of this sintered body with respect to a true specific gravity was 99.8%, while a transmission of a light having wavelength of 570 nm was 40% and a transmission of a light having wavelength of 395 nm was 2%. In addition, a surface roughness Ra of each of upper and lower surfaces of the circular-plate-shaped ceramic phosphor was 50 μm.

On the other hand, a flip chip type semiconductor light emitting diode having an emission peak wavelength of 395 nm and an outer size of 200 μm×200 μm was prepared, and there was prepared a packaging container having a diameter of 2 mm and a white-colored reflecting member 12 provided to a bottom surface and a wall surface of the packaging container as in Example 1. The above circular disc-shaped ceramic phosphor was positioned at a center of the bottom surface of the packaging container, and was adhered by an adhesive agent composed of a thin epoxy resin so that air was not mixed into a space between the circular disc-shaped ceramic phosphor and the packaging container, thereby to prepare a light emitting apparatus 1a of Example 5 shown in FIG. 1.

When an electric power of 3.5 volts and 20 mA was inputted to the light emitting apparatus 1a of Example 5, an emission output power was 350 mCd/m$^2$, while an emission chromaticity was: x=0.46, y=0.45. In addition, an ultraviolet output (ratio of ultraviolet emission) irradiated from the apparatus was 2% in comparison with a standard case where the sintered body as a ceramic phosphor was not attached thereto.

As described above, according to the light emitting apparatus of Example 5, the ceramic phosphor 11 having a predetermined transparency with respect to the using light having a wavelength was used, so that the light emitted from an inner portion of the phosphor could be effectively extracted to outside of the light emitting apparatus without being absorbed or scattered by an opaque phosphor powder as in the same manner as in Example 1

Examples 6-8

The same manufacturing process as in Example 5 was repeated except that only a thickness of the sintered body of the circular-plate-shaped ceramic phosphor 11 prepared in Example 5 was changed as shown in Table 2. Each of the ceramic phosphors 11 was attached to a central portion of a bottom surface of a packaging container, thereby to prepare respective light emitting apparatus of Examples 6-8 each having the same structure as in Example 5 shown in FIG. 1.

With respect to each of thus prepared light emitting apparatuses 1a, an emission output and an amount of ultraviolet light were measured at a time when an electric power was inputted under the same conditions as in Example 5, thereby to obtain results shown in Table 2 hereunder.

TABLE 2

| Sample No. | Thickness of Ceramic Phosphor (Sintered Body) (mm) | Emission Output (mCd/m$^2$) | Amount of Ultraviolet (%) |
|---|---|---|---|
| Example 6 | 0.3 | 300 | 10 |
| Example 7 | 0.8 | 370 | 0.5 |
| Example 8 | 1.3 | 400 | 0.1 |

As is clear from the results shown in Table 2, it was evidenced that when an amount of the transmitted ultraviolet (UV) light emitted from the light emitting apparatus was smaller, the higher emission output could be realized.

Comparative Examples 2-4

The same manufacturing process as in Example 5 was repeated except that a content (injection amount) of the phosphor powder prepared in Example 5 was changed as shown in Table 3, and each of the phosphor powders was injected into a light emitting diode package as the same manner as in Example 5, thereby to prepare respective light emitting apparatus of Comparative Examples 2-4.

With respect to each of thus prepared light emitting apparatuses 1a, an emission output and an amount of ultraviolet light were measured at a time when an electric power was inputted under the same conditions as in Example 5, thereby to obtain results shown in Table 3 hereunder.

TABLE 3

| Sample No. | Injection Amount (mg) | Emission Output (mCd/m²) | Amount of Ultraviolet (%) |
|---|---|---|---|
| Comparative Example 2 | 0.8 | 200 | 60 |
| Comparative Example 3 | 1.6 | 250 | 20 |
| Comparative Example 4 | 2.4 | 150 | 5 |

As is clear from the results shown in Table 3, according to the respective light emitting apparatuses of Comparative Examples 2-4, it was evidenced that even if the injection amount of the phosphor to be injected into the package was optimized so that the emission output at the light emitting apparatus was increased, the amount of the ultraviolet light radiated from the light emitting apparatus was disadvantageously increased.

Comparative Examples 5-9

The same manufacturing process as in Example 1 was repeated under the same conditions in Example 1 except that a blending ratio of the europium oxide to be contained in the phosphor material was changed to 0.01 mol thereby to prepare a phosphor material, and the injection amount of the phosphor powder to be injected into the light emitting diode package used in Example 5 was changed as shown in Table 4, thereby to prepare the respective light emitting apparatuses of Comparative Examples 5-9. In this regard, the above injection amount of the phosphor powder was indicated as a relative weight ratio in comparison with the injection rate (100%) in Example 5.

With respect to each of thus prepared light emitting apparatuses 1a, an emission output and an amount of ultraviolet light were measured at a time when an electric power was inputted under the same conditions as in Example 5, thereby to obtain results shown in Table 4 hereunder.

TABLE 4

| Sample No. | Injection Amount (%) | Emission Output (mCd/m²) | Amount of Ultraviolet (%) |
|---|---|---|---|
| Comparative Example 5 | 10 | 200 | 50 |
| Comparative Example 6 | 20 | 260 | 35 |
| Comparative Example 7 | 30 | 245 | 12 |
| Comparative Example 8 | 40 | 200 | 1.5 |
| Comparative Example 9 | 50 | 145 | 1 |

As is clear from the results shown in Table 4, according to the respective light emitting apparatuses of Comparative Examples 5-9, it was confirmed that even if the amount of phosphor powder to be injected into the package was set so as to provide an optimum concentration, the output of ultraviolet light was considerably large at an injection amount at which an output of visible light became maximum. Therefore, an efficiency of utilizing the ultraviolet light emitted from the light emitting element was decreased.

Examples 9-11

Oxides composed of: 0.98 mol of lanthanum oxide, 0.01 mol of europium oxide and 0.01 mol of samarium oxide were weighted and dissolved into nitric acid to prepare a material solution. Then, oxalic acid solution was added to this material solution, thereby to obtain a coprecipitation substance of oxalate. The coprecipitation substance was then sintered in air atmosphere at a temperature of 1000° C. thereby to be converted into oxide. 100 g of this oxide was mixed with 50 g of sulfur, 50 g of sodium carbonate and 14 g of potassium phosphate. Thus obtained mixture was injected into a crucible made of alumina and an airtight lid was attached to the crucible. In this state, the mixture was sintered at a temperature condition of 1100° C. for five hours. Thus obtained sintered body was sufficiently wet-cleaned, followed by drying. The dried material was then passed through the sieve, thereby to obtain a phosphor powder having a composition of $La_2O_2S$: Eu, Sm for emitting a red color light.

The above phosphor powder was shaped through a rubber pressing method thereby to prepare a pressed compact. Thereafter, the pressed compact was injected into a tantalum metal container and the tantalum metal container was sealed, followed by conducting a HIP treatment under a temperature condition of 1380° C. and a pressing force of 200 MPa. After completion of this HIP treatment, the metal container was broken so as to take out an ingot from which a sintered body of a circular disc-shaped ceramic phosphor having a diameter of 2 mm was cut out by conducting a dicing work. In the respective ceramic phosphors, a thickness of the ceramic phosphor was changed as indicated in Table 5.

A density of this sintered body was 99.8% with respect to a true specific density, while a transmission of a light having wavelength of 570 nm was 60% and a transmission of a light having wavelength of 470 nm was 40%. In addition, a surface roughness Ra of each of upper and lower surfaces of the ceramic phosphor was 50 μm.

Each of these sintered bodies was attached to the package as in the same manner as in Example 5, thereby to prepare the respective light emitting apparatuses of Examples 9-11. The results of emission outputs of red color lights emitted from the respective light emitting apparatuses are shown in Table 5 hereunder.

TABLE 5

| Sample No. | Thickness of Ceramic Phosphor (Sintered Body) (mm) | Emission Output (mCd/m²) | Amount of Ultraviolet (%) |
|---|---|---|---|
| Example 9 | 0.3 | 90 | 40 |
| Example 10 | 0.8 | 170 | 10 |
| Example 11 | 1.2 | 180 | 3 |

As is clear from the results shown in Table 5, according to the respective light emitting apparatuses of Examples 9-11, it was confirmed as a tendency that the emission output became to be maximum when the amount of ultraviolet light came close to zero, and it was cleared that an efficiency of utilizing the ultraviolet light emitted from the light emitting element was greatly increased.

In the above respective Examples, although the light emitting apparatus of the present invention has been explained by taking examples in which the semiconductor light emitting element is disposed to a central portion of the light emitting diode package, and the circular plate-shaped ceramic phosphor in a solid state is attached to the light emitting diode package, the present invention is not limited thereto.

For example, as shown in FIG. 2, the light emitting apparatus can be also configured such that a ceramic phosphor 11a having a semi-spherical shape is attached to a top portion of the resin substrate 13 onto which the semiconductor light emitting element 2 such as LED element or the like is disposed.

Further, as shown in FIG. 2, the light emitting apparatus can be also configured such that a ceramic phosphor 11b is formed in a shape of cannonball of which sectional diameter is decreased in top end direction, and the ceramic phosphor 11b is attached to a top portion of the resin substrate 13 onto which the semiconductor light emitting element 2 such as LED element or the like is disposed. In particular, when the ceramic phosphor 11b having a shape of cannonball is used, the light emitted from the semiconductor light-emitting element 2 is irradiated in such a manner that the light is refracted toward a central direction, so that there exhibits, so called "lens effect" in which a flux of the light is aligned toward an inherent light emitting direction. As a result, a light emitting intensity toward a front side direction can be increased.

INDUSTRIAL APPLICABILITY

As described above, according to the light emitting apparatus of the present invention, it becomes possible to provide a light emitting apparatus having a high luminous efficiency and an excellence in industrial productivity. In addition, all of the constituting parts including the phosphor can be formed in a solid state, an industrial production efficiency of the light emitting apparatus can be remarkably improved.

Figure 1:
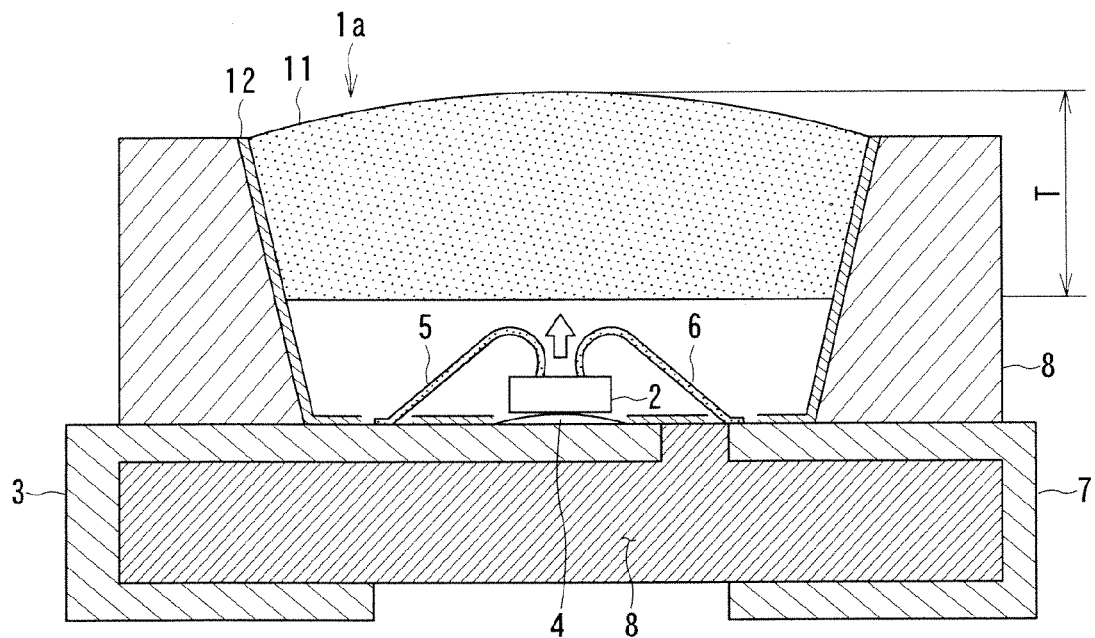
FIG. 1 is a sectional view showing an embodiment of the light emitting apparatus according to the present invention.
Figure 2:
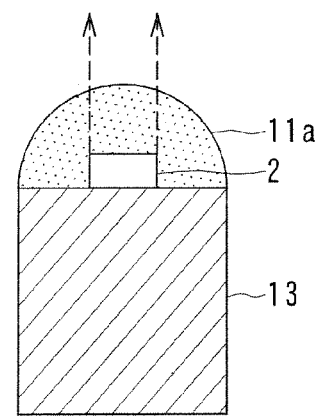
FIG. 2 is a sectional view showing another embodiment of the light emitting apparatus in which a ceramic phosphor is formed in a shape of semi-sphere.
Figure 3:
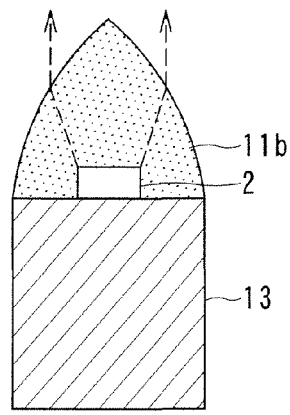
FIG. 3 is a sectional view showing another embodiment of the light emitting apparatus in which a ceramic phosphor is formed in a shape of cannonball.
Figure 4:
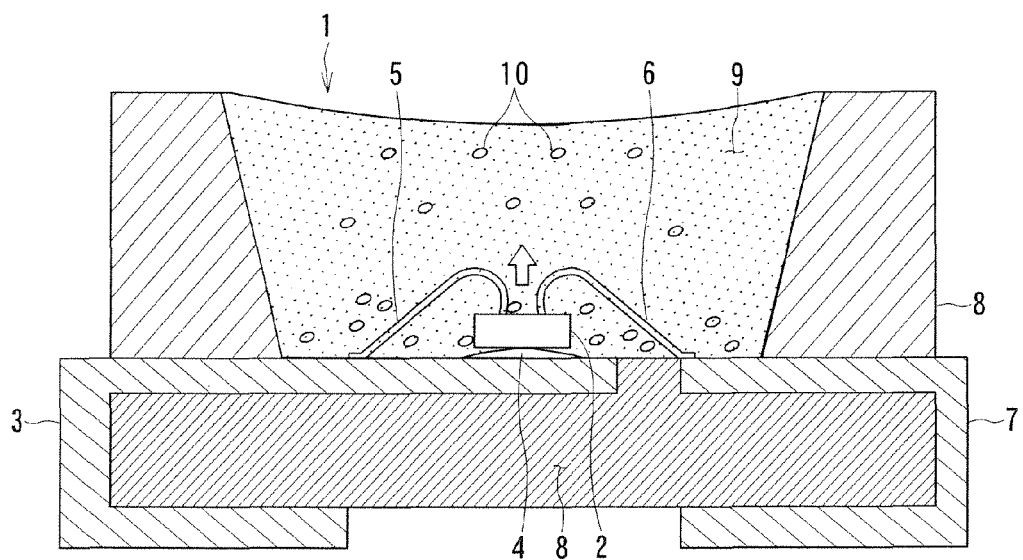
FIG. 4 is a sectional view showing an example of the configuration of a conventional light emitting apparatus comprising: a semiconductor light emitting element; and a phosphor powder dispersed around the semiconductor light emitting element through a resin material.

The invention claimed is:

1. A light emitting apparatus comprising:
a semiconductor light emitting element; and
a transparent ceramic phosphor for converting a wavelength of a light emitted from the semiconductor light emitting element, wherein
said ceramic phosphor has a relative density of 99.50 to 99.98% and has at least a part of the surface of which average surface roughness is 0.5 to 150 μm in terms of arithmetical average surface roughness Ra,
the semiconductor light emitting element emits an ultraviolet light, and
the ceramic phosphor corresponding to the semiconductor light emitting element has:
a minimum transmission of 0.1 to 40% under a wavelength of 350-420 nm; and
a transmission of 10 to 90% under an emission peak wavelength of the ceramic phosphor; and
wherein the ceramic phosphor is composed of at least one compound selected from the group consisting of silicate, aluminate, phosphate, halo-phosphate, borate, oxide, tungstate, salt of vanadic acid, oxysulfide, sulfide, nitride and oxynitride.

2. The light emitting apparatus according to claim 1, wherein said ceramic phosphor has an outer surface of which average surface roughness is 0.5 to 150 μm in terms of arithmetical average surface roughness Ra.

3. The light emitting apparatus according to claim 1, wherein said ceramic phosphor is formed with a projection having a maximum height of 0.15 to 2 mm, the projection being formed at least part of surface of said ceramic phosphor.

4. The light emitting apparatus according to claim 1, wherein said ceramic phosphor has an outer surface formed with a projection having a maximum height of 0.15 to 2 mm, the projection being formed at least part of surface of said ceramic phosphor.

5. The light emitting apparatus according to claim 1, wherein said ceramic phosphor is formed in a shape of a cannonball of which sectional diameter is decreased in top end direction.

6. The light emitting apparatus according to claim 1, wherein said ceramic phosphor is covered with a reflecting member at a portion other than the outer surface of the ceramic phosphor.

7. The light emitting apparatus according to claim 6, wherein said reflecting member is composed of aluminum or silver.

8. The light emitting apparatus according to claim 1, wherein said ceramic phosphor is formed by laminating a plurality of ceramic phosphor layers each having a different composition.

9. The light emitting apparatus according to claim 1, wherein said ceramic phosphor is composed of a sintered body having a thickness of 0.3 to 1.8 mm.

10. The light emitting apparatus according to claim 1, wherein said ceramic phosphor is composed of a sintered body having a circular plate shape.

11. A light emitting apparatus comprising:
a semiconductor light emitting element; and
a transparent ceramic phosphor for converting a wavelength of a light emitted from the semiconductor light emitting element, wherein
said ceramic phosphor has a relative density of 99.50 to 99.98% and has at least a part of the surface of which average surface roughness is 0.5 to 150 μm in terms of arithmetical average surface roughness Ra,
the semiconductor light emitting element emits a blue light, and
the ceramic phosphor corresponding to the semiconductor light emitting element has:
a minimum transmission of 20 to 80% under a wavelength of 420-500 nm; and
a transmission of 10 to 90% under an emission peak wavelength of the ceramic phosphor; and
wherein the ceramic phosphor is composed of at least one compound selected from the group consisting of silicate, aluminate, phosphate, halo-phosphate, borate, oxide, tungstate, salt of vanadic acid, oxysulfide, sulfide, nitride and oxynitride.

12. The light emitting apparatus according to claim 11, wherein said ceramic phosphor has an outer surface of which average surface roughness is 0.5 to 150 μm in terms of arithmetical average surface roughness Ra.

13. The light emitting apparatus according to claim 11, wherein said ceramic phosphor is formed with a projection having a maximum height of 0.15 to 2 mm, the projection being formed at least part of surface of said ceramic phosphor.

14. The light emitting apparatus according to claim 11, wherein said ceramic phosphor has an outer surface formed with a projection having a maximum height of 0.15 to 2 mm, the projection being formed at least part of surface of said ceramic phosphor.

15. The light emitting apparatus according to claim 11, wherein said ceramic phosphor is formed in a shape of a cannonball of which sectional diameter is decreased in top end direction.

16. The light emitting apparatus according to claim 11, wherein said ceramic phosphor is covered with a reflecting member at a portion other than the outer surface of the ceramic phosphor.

17. The light emitting apparatus according to claim 16, wherein said reflecting member is composed of aluminum or silver.

18. The light emitting apparatus according to claim 11, wherein said ceramic phosphor is formed by laminating a plurality of ceramic phosphor layers each having a different composition.

19. The light emitting apparatus according to claim 11, wherein said ceramic phosphor is composed of a sintered body having a thickness of 0.3 to 1.8 mm.

20. The light emitting apparatus according to claim 11, wherein said ceramic phosphor is composed of a sintered body having a circular plate shape.

* * * * *